US010936402B2

(12) United States Patent
Abali et al.

(10) Patent No.: US 10,936,402 B2
(45) Date of Patent: Mar. 2, 2021

(54) SPECULATIVE DATA PROCESSING AND RECOVERY

(71) Applicant: International Business Machines Corporation, Armonk, NY (US)

(72) Inventors: Bulent Abali, Tenafly, NJ (US); Bartholomew Blaner, Shelburne, VT (US); John J. Reilly, Huntington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 70 days.

(21) Appl. No.: 16/199,571

(22) Filed: Nov. 26, 2018

(65) Prior Publication Data
US 2020/0167224 A1    May 28, 2020

(51) Int. Cl.
*G06F 11/07* (2006.01)
*G06F 9/38* (2018.01)

(52) U.S. Cl.
CPC ........ *G06F 11/0793* (2013.01); *G06F 9/3842* (2013.01); *G06F 11/0721* (2013.01); *G06F 11/0751* (2013.01)

(58) Field of Classification Search
CPC .......................... G06F 11/0793; G06F 9/3842
See application file for complete search history.

(56) References Cited

U.S. PATENT DOCUMENTS

| 6,112,019 | A * | 8/2000 | Chamdani | ............ G06F 9/3836 712/214 |
| 6,839,808 | B2 | 1/2005 | Gruner et al. | |
| 7,103,725 | B2 | 9/2006 | Glasco | |
| 7,437,623 | B2 | 10/2008 | Larson et al. | |
| 8,933,824 | B1 | 1/2015 | Agarwal et al. | |
| 9,519,538 | B2 | 12/2016 | Ozer et al. | |
| 9,639,361 | B2 | 5/2017 | Gilkerson et al. | |
| 10,061,583 | B2 | 8/2018 | Ould-Ahmed-Vall et al. | |
| 2011/0119528 | A1 * | 5/2011 | Karlsson | ............ G06F 11/1405 714/25 |
| 2012/0227045 | A1 * | 9/2012 | Knauth | ................. G06F 9/3004 718/100 |
| 2017/0132010 | A1 * | 5/2017 | Vasekin | ................. G06F 9/384 |
| 2018/0129577 | A1 * | 5/2018 | Dusanapudi | .......... G06F 11/263 |

OTHER PUBLICATIONS

A.J. D'Souza, et al., ASIP Synthesis, High Level Modeling (2001 VLS), 15 pages, 2001.
Lewis, Low power asynchronous digital signal processing. Diss. Univeristy of Manchester, Oct. 2000, pp. 120-120, 268 total pages.
Silc et al., "Multiple-Issue Processors," Processory Architecture, Springer Berling Heidelberg, 1999, pp. 123-219.

\* cited by examiner

*Primary Examiner* — Chae M Ko
(74) *Attorney, Agent, or Firm* — Cantor Colburn LLP; Bryan Bortnick

(57) ABSTRACT

Aspects include copying a plurality of input data into a buffer of a processor configured to perform speculatively executing pipelined streaming of the input data. A bit counter maintains a difference in a number of input bits from the input data entering a pipeline of the processor and a number of the input bits consumed in the pipeline. The pipeline is flushed based on detecting an error. A portion of the input data is recirculated from the buffer into the pipeline based on a value of the bit counter.

20 Claims, 5 Drawing Sheets

SPECULATIVE DATA PROCESSING AND RECOVERY

BACKGROUND

The present invention relates to computer systems, and more particularly, to speculative data processing and recovery.

High-performance microprocessor designs use processing pipelines from dispatch through completion to accelerate processing. Some types of data can include variable bit length symbols with lengths that may not be known early in a processing pipeline due to length dependence between consecutive symbols. The processing of such input data can limit performance and throughput in a processing pipeline.

SUMMARY

According to one or more embodiments of the present invention, a computer-implemented method includes copying a plurality of input data into a buffer of a processor configured to perform speculatively executing pipelined streaming of the input data. A bit counter maintains a difference in a number of input bits from the input data entering a pipeline of the processor and a number of the input bits consumed in the pipeline. The pipeline is flushed based on detecting an error. A portion of the input data is recirculated from the buffer into the pipeline based on a value of the bit counter.

Other embodiments of the invention implement the features of the above-described method in a computer system and in a computer program product.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
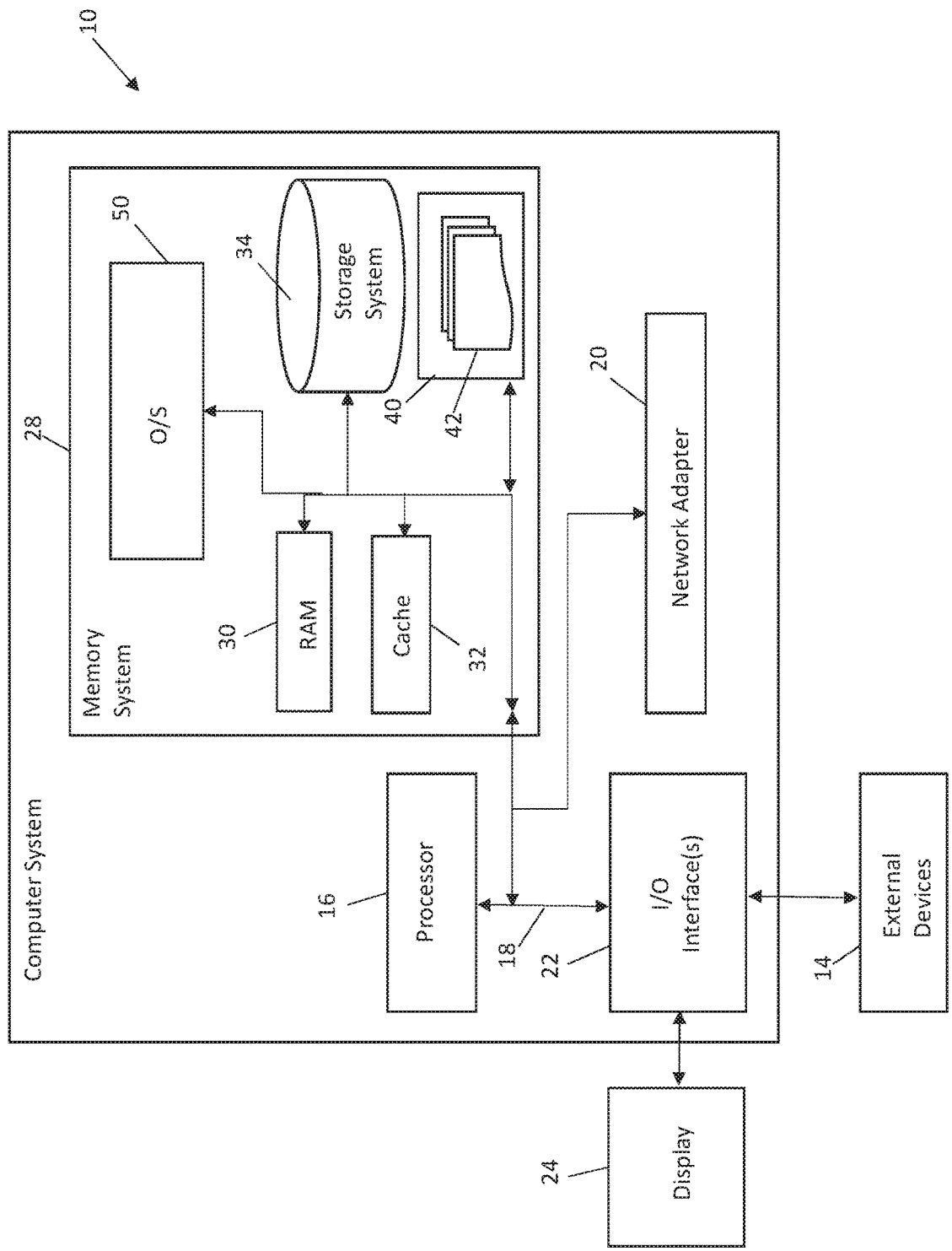
FIG. 1 is a block diagram illustrating a computer system in accordance with various embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, processors, and coprocessors can include support for special functions that accelerate system performance. Tasks such as data compression, encryption, and random number generation can be processing intensive, particularly with large files or data sets. Pipelined processing can be used to start a sequence of operations with continued performance of the operations without waiting for earlier operations in the sequence to complete before starting subsequent operations. Pipelined processing is effective when there is limited dependency between sequential operations. Some types of operations include a high degree of dependency, such as decoding variable length symbols. When a decoding alignment error is detected in a late stage of the pipeline, other values still in-flight within the pipeline may also be misaligned, resulting in subsequent decoding errors until the misalignment is corrected. Alternatively, processing of variable length symbols can be performed sequentially without pipelined operations; however, the resulting process may be much slower than a pipelined implementation.

Turning now to an overview of the aspects of the invention, one or more embodiments of the invention address the above-described shortcomings of the prior art by speculatively executing pipelined streaming of data in a processor. Pipelining allows processing stages to be initiated in a sequence where a stream of operations in the sequence can be started prior to completion of a previous operation. Speculative execution attempts to proceed as if an operation was correct until advancing sufficiently through the pipeline to resolve whether speculative operations were correct or incorrect. A buffer captures a copy of a portion of a bit stream of input data received at a pipeline of a processor. A bit counter maintains a running count of input bits entering the pipeline and subtract a number of bits exiting the pipeline. A speculation resolving pipeline stage detects whether the pipeline performed incorrect computations, for instance, where a decoding alignment error is detected. The bit counter is used to flush a portion of the pipeline and determine a number of bits to be recirculated from the buffer. Alternatively, the pipeline can be completely flushed, and the bit counter can be used to determine the number of bits to be recirculated into the pipeline from the buffer before resuming the stream of input data into the pipeline.

The above-described aspects of the invention address the shortcomings of the prior art by canceling and retrying incorrect computations in a speculatively executing pipeline of a processor. After detecting a decoding error, for instance, based on an end-of-block symbol or a next block header decoded as a symbol, the position of the end-of-block symbol is used to adjust decoding alignment upon recirculation. For instance, data can be extracted from the next block header before recirculation, and the recirculation can be adjusted to begin at a next symbol boundary after the next block header. Technical effects and benefits can include speculative decoding of variable length data unit encoding through a pipeline that accelerates processing by speculatively decoding multiple symbols at the same time and recovering from symbol boundary errors.

With reference now to FIG. 1, a computer system 10 is illustrated in accordance with a non-limiting embodiment of the present disclosure. The computer system 10 may be based on the IBM Z architecture or POWER architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Further, elements of the computer system 10 can be incorporated in one or more network devices to support computer network functionality, such as a network switch, a network router, or other such network support devices.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a computing device, also referred to as a processing device. The components of computer system may include, but are not limited to, a processor 16 including one or more processing cores or processing units, a memory system 28, and a bus 18 that operably couples various system components including memory system 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that are accessible by computer system/server 10, and they include both volatile and non-volatile media, removable and non-removable media.

Memory system 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory system 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include communication protocol support as one or more drivers to implement various protocol layers in a protocol stack (e.g., transmission control protocol/internet protocol (TCP/IP)) to support communication with other computer systems across one or more computer networks.

The storage system 34 can store a basic input output system (BIOS). The BIOS is a set of essential routines that initialize and test hardware at startup, start execution of the OS 50, and support the transfer of data among the hardware devices. When the computer system 10 is in operation, the processor 16 is configured to execute instructions stored within the storage system 34, to communicate data to and from the memory system 28, and to generally control operations of the computer system 10 pursuant to the instructions.

Program/utility 40, having a set (at least one) of program modules 42, may be stored in memory system 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein at an application layer level in a communication protocol stack.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
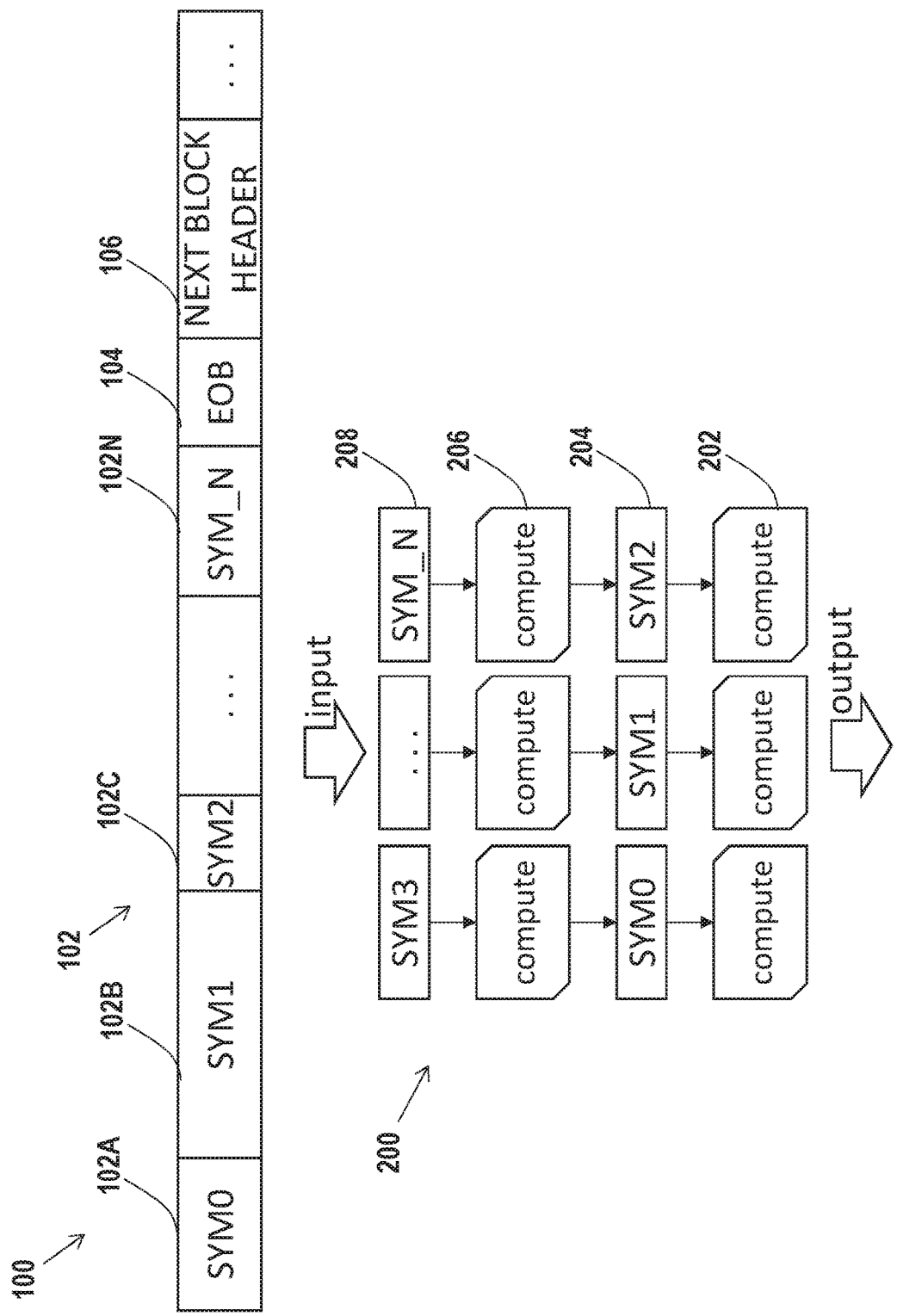
FIG. 2 is a block diagram of pipelined processing of a sequentially dependent input stream according to a non-limiting embodiment.

Turning now to a more detailed description of aspects of the present invention, FIG. 2 depicts a block diagram of input data 100 formatted as a sequentially dependent input stream that can be input to a pipeline 200 of the processor 16 of FIG. 1. In the example of FIG. 2, the input data 100 includes a plurality of symbols 102, where a first symbol 102A, a second symbol 10B, a third symbol 102C, through a last symbol 102N can have a variable number of bits per symbol 102. An example of such an encoding of variable length data units is Huffman encoding used in data compression and decompression, where each symbol 102 can vary between one and twenty-eight bits long, and the bit length of the symbols 102 is unknown prior to decoding. An end-of-block symbol 104 can indicate the end of a block of the symbols 102, which can be followed by a next block header 106 associated with another block of the symbols 102. Rather than decoding each of the symbols 102 one at a time, the pipeline 200 groups the symbols 102 through a plurality of computation stages performed in parallel. For instance, a first group 204 of the symbols 102 can be passed to computation stages 202 to speculatively decode three of the symbols 102 at the same time. Speculation involves guessing the bit lengths of the multiple variable length symbols 102. Similarly, a second group 208 of the symbols 102 can be passed to computation stages 206 of the pipeline 200 in parallel. In the example of FIG. 2, the computation stages 202 are collectively a final stage for resolving decoding within the pipeline 200, and the computation stages 206 may perform a partial speculative decoding that is not fully resolved until the computation stages 202.

The computation stages 206 may be considered as "guess" decoding, where it is unknown whether the decoding was correct until reaching computation stages 202. If the guess was correct, a high throughput objective is achieved because multiple symbols 102 are successfully processed in parallel. For example, three symbols 102 per cycle may be processed, as depicted in the example of FIG. 2. Other structural variations of the pipeline 200 are contemplated, such as two or four symbols 102 processed in parallel. If a guess is incorrect, the decoded values are wrong and must be discarded. The decoding process is restarted from a prior point in the data stream of input data 100. The correctness of a guess is known in the last stage (e.g., a resolving stage) of the pipeline 200 in this embodiment; however, the resolving stage may occur prior to the last stage in some embodiments.

Repetition of the decoding process can be enabled by a buffer. A buffer, such as a shadow buffer, can hold a copy of the input bits in a first-in first-out (FIFO) order. The buffer capacity can be made greater than or equal to a maximum possible number of bits in the pipeline 200, e.g., the total storage capacity between the input and the resolving stage. If the computations in the pipeline 200 are correct, the buffer contents can be discarded in FIFO fashion. If the computations in the pipeline 200 are wrong, the intermediate computation results in the pipeline 200 can be flushed and the computations restarted with a copy of the flushed bits which were saved in the buffer. Further details are provided with respect to FIGS. 3-5.

Figure 3:
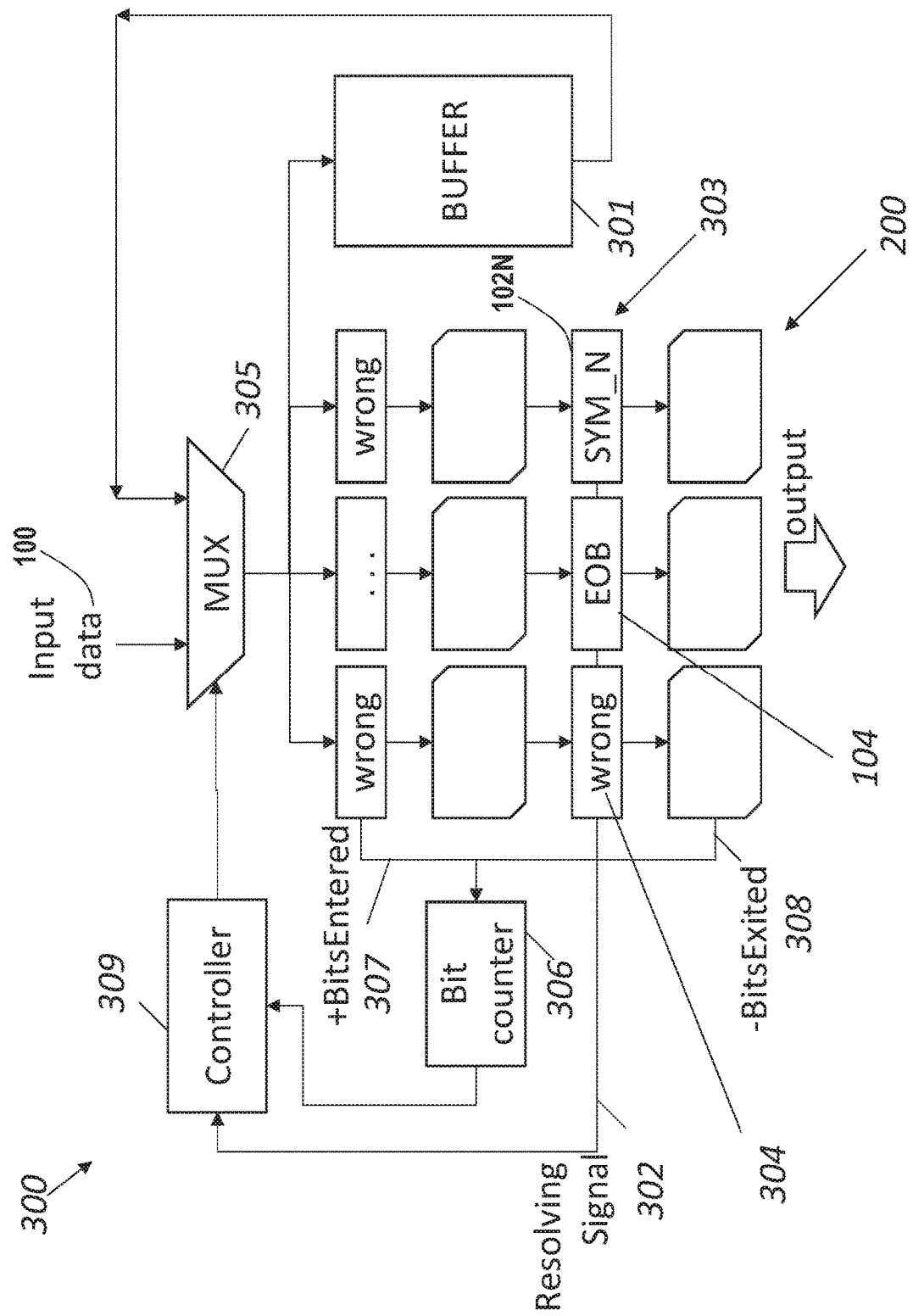
FIG. 3 is a block diagram of a speculative data processing and recovery pipeline according to a non-limiting embodiment.

FIG. 3 depicts a system 300 according to an embodiment, where a buffer 301 is a shadow buffer operably coupled to the pipeline 200. A resolving signal 302 can be output from a speculation resolving pipeline stage 303 of the pipeline 200, where the resolving signal 302 indicates whether an error has been detected, such as a decoding error. In the example of FIG. 3, the speculation resolving pipeline stage 303 decodes the last symbol 102N of a current block and an end-of-block symbol 104 that marks the end of a compressed block. As depicted in the example of FIG. 2, the end-of-block symbol 104 can be followed by the next block header 106, which is not a symbol. With the speculative decode, in this embodiment, the end-of-block symbol 104 is not decoded until the speculation resolving pipeline stage 303. As such, the pipelined computations treat the bits following end-of-block symbol 104 incorrectly as symbol bits due to speculation, resulting in a wrong decode value 304. When the end-of-block symbol 104 is finally decoded in the speculation resolving pipeline stage 303, the resolving signal 302 can be sent to a controller 309 to indicate that the symbol has been finally decoded as the end-of-block symbol 104. After the resolving signal 302 has been received, the controller 309 can determine that the data bits in the preceding stages of the pipeline 200 have been incorrectly decoded with multiple speculative computations that have the wrong decode value 304.

The controller 309 can invalidate (e.g., flush) the data in the pipeline 200 and instruct a multiplexer (MUX) 305 to switch from the input data 100 to receive recirculated input from the buffer 301. A bit counter 306 can be used to determine how much data to receive from the buffer 301 during recirculation. The bit counter 306 can keep a running count of the difference between data bits entered 307 into the pipeline 200 minus the data bits consumed 308 (e.g., bits exited) from the pipeline 200. The bit counter 306 is operably coupled to the controller 309. Thus, the controller 309 knows how many incorrectly processed input bits must be flushed from the pipeline 200 and the same amount of input can be resent into the pipeline 200 from the buffer 301.

The MUX 305 can be enabled to receive input from the buffer 301 for a number of bits recorded in the bit counter 306. Once the incorrect speculation has been retried, then the controller 309 can switch the MUX 305 back to the input data 100. Additional coordination signaling can be included, such as pausing an upstream source of the input data 100 until the recirculation from the buffer 301 is substantially complete.

Figure 4:
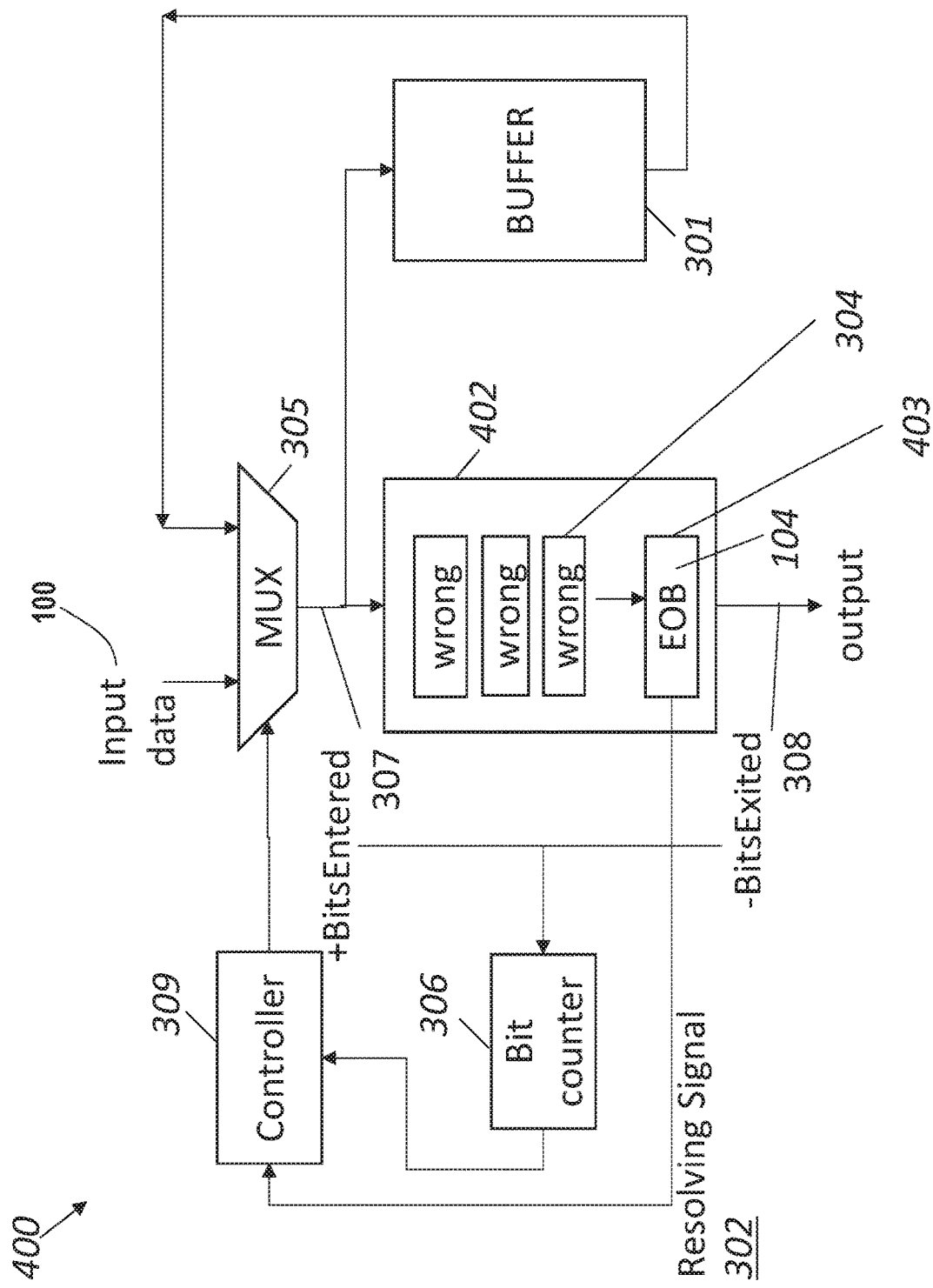
FIG. 4 is a block diagram of a speculative data processing and recovery pipeline according to a non-limiting embodiment.

FIG. 4 depicts a system 400 according to an embodiment as a variation of the system 300 of FIG. 3. In FIG. 4, the system 400 includes the MUX 305 operable to receive input from the input data 100 or the buffer 301 responsive to a selection from the controller 309. Rather than performing multiple computations, such as partial decodes, at each stage of a pipeline, the pipeline 402 has a single computation per stage, ending with a speculation resolving pipeline stage 403. The speculation resolving pipeline stage 403 can be the last stage of the pipeline 402. In the example of FIG. 4, the end-of-block symbol 104 is not fully decoded until the speculation resolving pipeline stage 403, and the end-of-block symbol 104 is followed by the next block header 106 of FIG. 2, which is not a symbol. As such, the pipelined computations treat the bits following end-of-block symbol 104 incorrectly as symbol bits due to speculation, resulting in a wrong decode value 304. When the end-of-block symbol 104 is finally decoded in the speculation resolving pipeline stage 403, the resolving signal 302 can be sent to a controller 309 to indicate that the symbol has been finally decoded as the end-of-block symbol 104. After the resolving signal 302 has been received, the controller 309 can determine that the data bits in the preceding stages of the pipeline 402 have been incorrectly decoded with multiple speculative computations that have the wrong decode value 304. Once an incorrect decode has been detected, the semi-decoded bits in the pipeline 402 can be discarded. The bit counter 306 (e.g., data bits entered 307 minus data bits consumed 308) can be used to recirculate bits from the buffer 301 with decoding aligned to the end-of-block symbol 104 so that the correct decode sequence can be performed.

Figure 5:
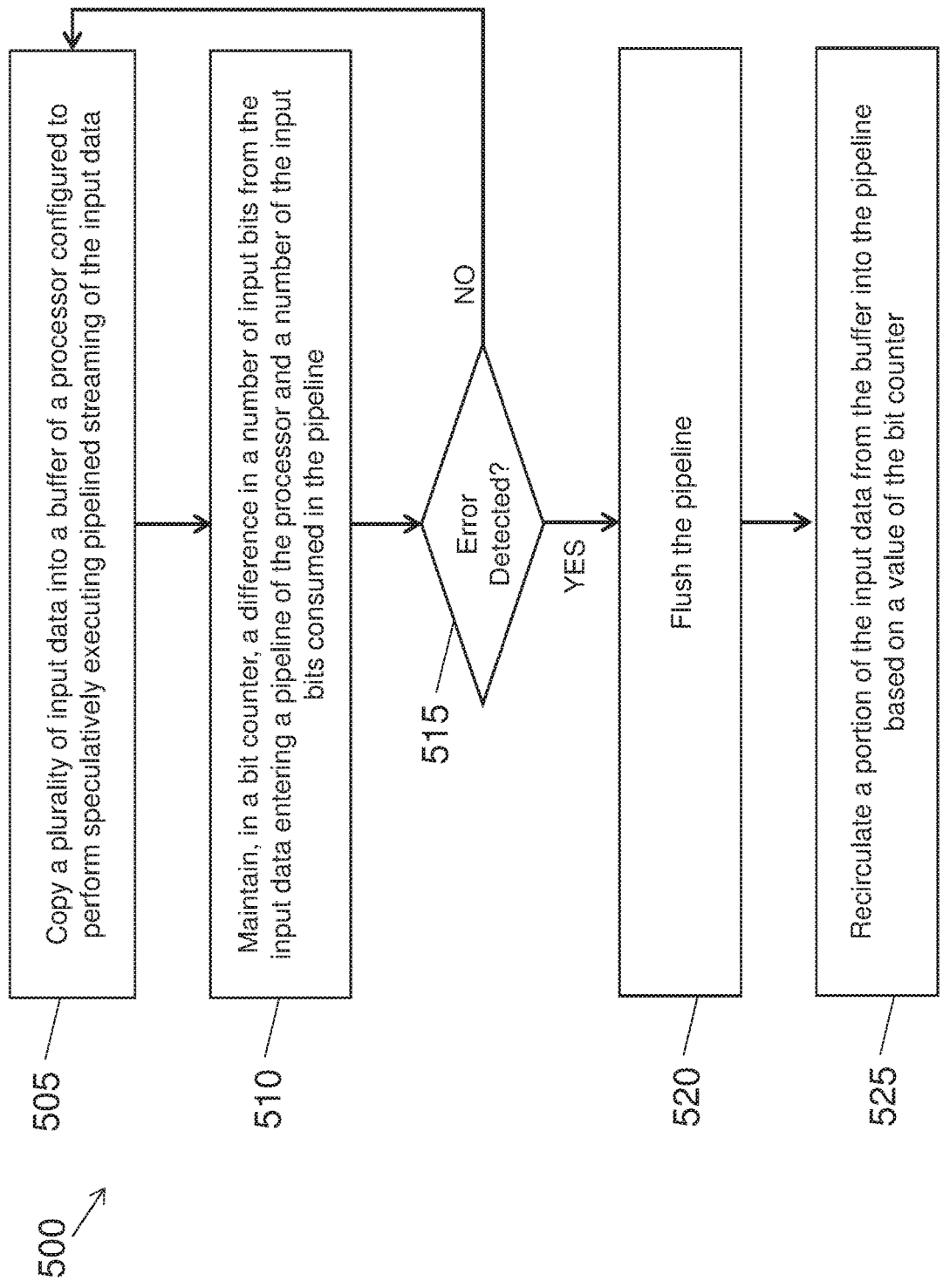
FIG. 5 is a flow diagram illustrating a method according to a non-limiting embodiment.

Turning now to FIG. 5, a flow diagram of a process 500 is generally shown in accordance with an embodiment. The process 500 is described with reference to FIGS. 1-5 and may include additional steps beyond those depicted in FIG. 5. The process 500 can be performed by the processor 16 of FIG. 1.

At block 505, the controller 309 can perform copying of a plurality of input data 100 into a buffer 301 of the processor 16 configured to perform speculatively executing pipelined streaming of the input data 100. The controller 309 can control settings of the MUX 305 to ensure that the buffer 301 is populated as a shadow first-in-first-out buffer with a copy of the input data 100 being written to the pipeline 200, 402. Accordingly, the buffer 301 can be sized with a greater bit capacity than the pipeline 200, 402.

At block 510, a bit counter 306 maintains a difference in a number of input bits (e.g., data bits entered 307) from the input data 100 entering the pipeline 200, 402 of the processor 16 and a number of the input bits consumed (e.g., data bits consumed 308) in the pipeline 200, 402. The pipeline 200 can include a plurality of computation blocks (e.g., computation stages 206) configured to speculatively decode a plurality of symbols 102 in parallel having variable symbol lengths. The computation blocks can apply coding for a compression or decompression operation, for example.

At block 515, the pipeline 200, 402 can determine whether an error is detected. The error can be detected based on resolving an end-of-block symbol 104 in a speculation resolving pipeline stage 303, 403 of the pipeline 200, 402. The error can include speculatively decoding a next block header 106 as one or more symbols 102. The next block header 106 can be used to adjust an initial symbol alignment of a next block of symbols upon recirculation. The end-of-block symbol 104 can be used to adjust an initial symbol alignment of a next block of symbols upon recirculation.

At block 520, the controller 309 can flush the pipeline 200, 402 based on detecting an error. Flushing can include total clearing of the pipeline 200, 402 or a limited clearing of the pipeline 200, 402 based on the count value of the bit counter 306. At block 525, the controller 309 can control recirculating a portion of the input data from the buffer 301 into the pipeline 200, 402 based on a value of the bit counter 306.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
    copying a plurality of input data into a buffer of a processor configured to perform speculatively executing pipelined streaming of the input data;
    maintaining, in a bit counter, a difference in a number of input bits from the input data entering a pipeline of the processor and a number of the input bits consumed in the pipeline;
    flushing the pipeline based on detecting an error; and
    recirculating a portion of the input data from the buffer into the pipeline based on a value of the bit counter.

2. The computer-implemented method of claim 1, wherein the pipeline comprises a plurality of computation blocks configured to speculatively decode a plurality of symbols having variable symbol lengths.

3. The computer-implemented method of claim 2, wherein the computation blocks apply coding for a compression or decompression operation.

4. The computer-implemented method of claim 2, wherein the error is detected based on resolving an end-of-block symbol in a speculation resolving pipeline stage of the pipeline.

5. The computer-implemented method of claim 4, wherein the error comprises speculatively decoding a next block header as one or more symbols.

6. The computer-implemented method of claim 5, wherein the next block header is used to adjust an initial symbol alignment of a next block of symbols upon recirculation.

7. The computer-implemented method of claim 4, wherein the end-of-block symbol is used to adjust an initial symbol alignment of a next block of symbols upon recirculation.

8. The computer-implemented method of claim 1, wherein the buffer is a shadow first-in-first-out buffer sized with a greater bit capacity than the pipeline.

9. A system of a processor, the system comprising:
a buffer;
a bit counter;
a pipeline configured to perform speculatively executing pipelined streaming of a plurality of input data; and
a controller configured to perform a plurality of operations comprising:
copying the input data into the buffer;
maintaining, in the bit counter, a difference in a number of input bits from the input data entering the pipeline and a number of the input bits consumed in the pipeline;
flushing the pipeline based on detecting an error; and
recirculating a portion of the input data from the buffer into the pipeline based on a value of the bit counter.

10. The system of claim 9, wherein the pipeline comprises a plurality of computation blocks configured to speculatively decode a plurality of symbols in parallel having variable symbol lengths.

11. The system of claim 10, wherein the error is detected based on resolving an end-of-block symbol in a speculation resolving pipeline stage of the pipeline.

12. The system of claim 11, wherein the error comprises speculatively decoding a next block header as one or more symbols.

13. The system of claim 12, wherein the next block header is used to adjust an initial symbol alignment of a next block of symbols upon recirculation.

14. The system of claim 11, wherein the end-of-block symbol is used to adjust an initial symbol alignment of a next block of symbols upon recirculation.

15. The system of claim 9, wherein the buffer is a shadow first-in-first-out buffer sized with a greater bit capacity than the pipeline.

16. A computer program product comprising a computer readable storage medium having program instructions embodied therewith, the program instructions executable by a processor to perform a plurality of operations comprising:
copying a plurality of input data into a buffer of a processor configured to perform speculatively executing pipelined streaming of the input data;
maintaining, in a bit counter, a difference in a number of input bits from the input data entering a pipeline of the processor and a number of the input bits consumed in the pipeline;
flushing the pipeline based on detecting an error; and
recirculating a portion of the input data from the buffer into the pipeline based on a value of the bit counter.

17. The computer program product of claim 16, wherein the pipeline comprises a plurality of computation blocks configured to speculatively decode a plurality of symbols in parallel having variable symbol lengths.

18. The computer program product of claim 17, wherein the error is detected based on resolving an end-of-block symbol in a speculation resolving pipeline stage of the pipeline and the error comprises speculatively decoding a next block header as one or more symbols.

19. The computer program product of claim 17, wherein the computation blocks apply coding for a compression or decompression operation.

20. The computer program product of claim 16, wherein the buffer is a shadow first-in-first-out buffer sized with a greater bit capacity than the pipeline.

\* \* \* \* \*